United States Patent [19]

Urano et al.

[11] Patent Number: 5,350,660
[45] Date of Patent: Sep. 27, 1994

[54] CHEMICAL AMPLIFIED RESIST MATERIAL CONTAINING PHOTOSENSITIVE COMPOUND CAPABLE OF GENERATING AN ACID AND SPECIFIC POLYSTYRENE COPOLYMER HAVING FUNCTIONAL GROUPS THAT BECOME ALKALI-SOLUBLE UNDER AN ACID ATMOSPHERE

[75] Inventors: Fumiyoshi Urano, Niiza; Masaaki Nakahata, Kawagoe; Hirotoshi Fujie, Saitama; Keiji Oono, Sakado, all of Japan

[73] Assignee: Wako Pure Chemical Industries, Ltd., Osaka, Japan

[21] Appl. No.: 646,026

[22] Filed: Jan. 28, 1991

[30] Foreign Application Priority Data

| | | |
|---|---|---|
| Jan. 30, 1990 [JP] | Japan | 2-019611 |
| Jan. 30, 1990 [JP] | Japan | 2-019612 |
| Jan. 30, 1990 [JP] | Japan | 2-019614 |
| Jan. 30, 1990 [JP] | Japan | 2-019617 |
| Nov. 30, 1990 [JP] | Japan | 2-329552 |

[51] Int. Cl.$^5$ .................. G03F 7/021; G03C 1/52
[52] U.S. Cl. .................. 430/176; 430/170; 430/270; 430/907; 430/909; 430/921; 430/923; 430/925; 522/28; 522/59; 522/65; 522/68
[58] Field of Search ............... 430/170, 176, 270, 907, 430/909, 921, 923, 925; 522/28, 59, 65, 68; 526/334, 346, 347

[56] References Cited

U.S. PATENT DOCUMENTS

| | | | |
|---|---|---|---|
| 3,798,034 | 3/1974 | Laridon | 430/293 |
| 4,343,885 | 8/1982 | Reardon, Jr. | 430/286 |
| 4,491,628 | 1/1985 | Ito et al. | 430/176 |
| 4,603,101 | 7/1986 | Crivello | 430/270 |
| 4,678,737 | 7/1987 | Schneller | 430/270 |
| 4,828,958 | 5/1989 | Hayase et al. | 430/175 |

FOREIGN PATENT DOCUMENTS

| | | |
|---|---|---|
| 0330386 | 8/1989 | European Pat. Off. . |
| 0342498 | 11/1989 | European Pat. Off. . |
| 0366590 | 5/1990 | European Pat. Off. . |
| 58-184944 | 10/1983 | Japan . |
| 63-36602 | 7/1988 | Japan . |
| 6480944 | 3/1989 | Japan . |
| 1-154048 | 6/1989 | Japan . |
| 1-155338 | 6/1989 | Japan . |
| 1-155339 | 6/1989 | Japan . |
| 1-188852 | 7/1989 | Japan . |
| 2-12153 | 1/1990 | Japan . |
| 1231780 | 9/1967 | United Kingdom . |

OTHER PUBLICATIONS

SPIE's 1989 Symposium, 1086-03, pp. 22–33.
SPIE's 1989 Symposium, 1086-40, pp. 357–362.
SPIE's 1989 Symposium, 1086-01, pp. 2–9.
Polymer Bulletin 20, (1988), pp. 427–434.
Polymer Mater., Sci. Eng. 61, (1989), pp. 412–416.
Polymer Eng. Sci. 23, (1983), pp. 1012–1018.
*Tet. Let.*, 14, Apr., 1978 pp. 1255–1258.

*Primary Examiner*—Charles L. Bowers, Jr.
*Assistant Examiner*—Christopher G. Young
*Attorney, Agent, or Firm*—Armstrong, Westerman, Hattori, McLeland & Naughton

[57] ABSTRACT

A resist material comprising (a) a polymer having a monomer unit having a special functional group, a monomer unit having a phenolic hydroxyl group, and if necessary a third monomer unit, (b) a photoacid generator, and (c) a solvent can provide a resist film excellent in heat resistance and adhesiveness to a substrate when exposed to light with 300 nm or less such as deep UV light, KrF excimer laser light, etc., and is suitable for forming ultrafine patterns.

19 Claims, 2 Drawing Sheets

CHEMICAL AMPLIFIED RESIST MATERIAL CONTAINING PHOTOSENSITIVE COMPOUND CAPABLE OF GENERATING AN ACID AND SPECIFIC POLYSTYRENE COPOLYMER HAVING FUNCTIONAL GROUPS THAT BECOME ALKALI-SOLUBLE UNDER AN ACID ATMOSPHERE

BACKGROUND OF THE INVENTION

This invention relates to a resist material usable in the production of semiconductor elements. More particularly the present invention relates to a resist material used in the formation of a positive tone pattern using deep ultraviolet (UV) light of 300 nm or less such as KrF excimer laser light, etc.

With recent higher density and larger scale integration of semiconductor devices, wavelengths used in exposing devices for minute processing, particularly for lithography become shorter and shorter. Now, KrF excimer laser light (248.4 nm) is studied. But, there have been no photosensitive materials suitable for use as such a wavelength.

For example, there are proposed dissolution inhibiting type resist materials comprising a resin having high transmittance for light of near 248.4 nm and a photosensitive compound having a group of the formula:

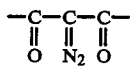   (XV)

as a resist material for a light source such as KrF excimer laser light and deep UV light (e.g. Japanese Patent Unexamined Publication Nos. 1-80944, 1-154048, 1-155338, 1-155339, and 1-18852; Y. Tani et al: SPIE's 1989 Sympo., 1086-03, etc.). But, these dissolution inhibiting type resist materials are low in sensitivity, and thus cannot be used for deep UV light and KrF excimer laser light which require highly sensitive resist materials.

On the other hand, in order to reduce the exposure energy amount (so as to increase the sensitivity), chemical amplified resist materials we recently have proposed wherein an acid generated by exposure to light is used as a catalyst [H. Ito et al: Poly. Eng. Sci. vol. 23, page 1012 (1983)]. Various chemical amplified resist materials are reported, for example, in U.S. Pat. Nos. 4,491,628 and 4,603,101, Japanese Patent Unexamined Publication No. 62-115440, W. R. Brunsvold et al: SPIE's 1989 Sympo., 1086-40, T. Neenan et al: SPIE's 1989 Sympo., 1086-01, etc. But these chemical amplified resist materials have the following disadvantages. When phenol ether type resins such as poly(4-tert-butoxycarbonyloxystyrene), poly(4-tert-butoxycarbonyloxy-α-methylstyrene), poly(4-tert-butoxystyrene), poly(4-tert-butoxy-α-methylstyrene) are used, heat resistance is poor, and resist films are easily peeled off at the time of development due to poor adhesion to substrates, resulting in a failure to obtain pattern shapes. Further, when carboxylic acid ester type resins such as poly(tert-butyl-4-vinylbenzoate), etc. are used, the transmittance for light of near 248.4 nm is poor due to the aromatic rings of the resin. When poly(tert-butylmethacryalte) and the like is used as the resin, heat resistance and resistance to dry etching are poor. As mentioned above, the chemical amplified resist materials have higher sensitivity than known resist materials, but are poor in heat resistance of resin, poor in adhesiveness to substrates, and insufficient in transmittance for light of near 248.4 nm, resulting in making practical use difficult. Thus, practically usable highly sensitive resist materials overcoming these problems mentioned above are desired.

SUMMARY OF THE INVENTION

It is an object of the present invention to provide a positive tone resist material having high transmittance for deep UV light, KrF excimer laser light, etc., having high sensitivity for exposure to these light sources or irradiation of electron beams and X-rays, and using a special polymer remarkably excellent in heat resistance and adhesiveness to a substrate.

The present invention provides a resist material comprising (a) a polymer represented by the formula:

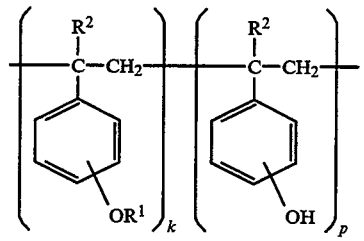

wherein $R^1$ is a methyl group, an isopropyl group, a tert-butyl group, a tetrahydropyranyl group, a trimethylsilyl group, or a tert-butoxycarbonyl group; $R^2$ is a hydrogen atom or a methyl group; and k and p are independently an integer of 1 or more provided that $k/(k+p) = 0.1$ to $0.9$, (b) a photosensitive compound capable of generating an acid by exposure to light, and (c) a solvent for dissolving the components (a) and (b).

The present invention also provides a resist material comprising (a) a polymer represented by the formula:

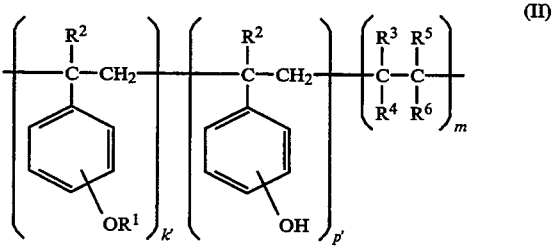   (II)

wherein $R^1$ and $R^2$ are as defined above; $R^3$ and $R^5$ are independently a hydrogen atom or a methyl group; $R^4$ is a hydrogen atom, a carboxyl group, a cyano group, or a group of the formula:

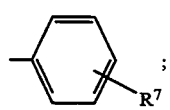   (III)

$R^7$ is a hydrogen atom, a halogen atom or a lower alkyl group preferably having 1 to 4 carbon atoms; $R^6$ is a hydrogen atom, a cyano group, or $-COOR^8$; $R^8$ is a straight-chain, branched or cyclic alkyl group having 1 to 10 carbon atoms; k', p' and m are independently an integer of 1 or more provided that $0.1 \leq k'/(k'+p') \leq 0.9$ and $0.05 \leq m/(k'+p'+m) \leq 0.50$, (b) a photosensitive compound capable of generating an acid by exposure to light, and (c) a solvent for dissolving the components (a) and (b).

DESCRIPTION OF THE PREFERRED EMBODIMENTS

Figure 1A:
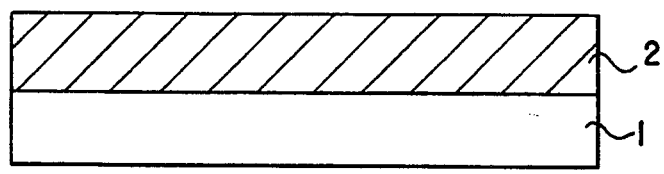
FIGS. 1(a) to 1(c) are schematic cross-sectional views explaining a positive tone pattern forming process using the resist material of the present invention.

The resist material of the present invention applys chemical amplification so as to make an exposure energy amount as low as possible. That is, the resist material of the present invention comprises (a) a polymer having a monomer unit having a functional group which becomes alkali-soluble by chemical change with heating under an atmosphere of an acid generated from a photosensitive compound when exposed to light, a monomer unit having a phenolic hydroxyl group, and if necessary a third monomer unit, (b) a photosensitive compound having high transmittance for light of near 248.4 nm and capable of generating an acid by exposure to light or by irradiation (hereinafter referred to as "photoacid generator"), and (c) a solvent for the components (a) and (b).

The monomer unit having a functional group (special functional group) which becomes alkali-soluble by chemical change with heating in the presence of the acid can be obtained from p- or m-hydroxystyrene derivatives having protective groups which are released by the acid and p- or m-hydroxy-α-methylstyrene derivatives having protective groups which are released by the acid. Concrete examples of such monomers are p- or m-methoxystyrene, p- or m-isopropoxystyrene, p- or m-tert-butoxystyrene, p- or m-tetrahydropyranyloxystyrene, p- or m-trimethylsilyloxystyrene, p- or m-tert-butoxycarbonyloxystyrene, and p- or m-hydroxy-α-methylstyrene derivatives having the same protective groups as these p-hydroxystyrene derivatives mentioned above.

The monomer unit having a phenolic hydroxyl group can be obtained from p- or m-vinylphenol and p- or m-hydroxy-α-methylstyrene.

The third monomer unit which is used depending on purpose and which has a function of enhancing the transmittance for light of the polymer as a whole at near 248.4 nm can be obtained from α-methylstyrene, p-chlorostyrene, acrylonitrile, fumaronitrile, methyl methacrylate, tert-butyl methacrylate, tert-butyl p-ethylphenoxyacetate, etc.

The polymer has the monomer unit having the special functional group and the monomer unit having a phenolic hydroxyl group in a constituting ratio of 1:9 to 9:1. Considering heat resistance of the polymer and adhesiveness to substrate, the constituting ratio is preferably in the range of 2:8 to 7:3.

Preferable examples of the polymer of the formula:

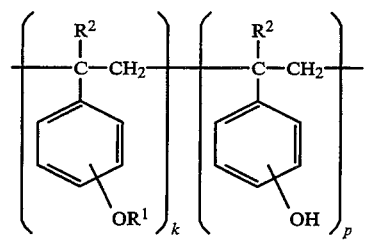

are those having a tert-butyl group, a tetrahydropyranyl group or a trimethylsilyl group as $R^1$ and a hydrogen atom as $R^2$.

Preferable examples of the polymer of the formula:

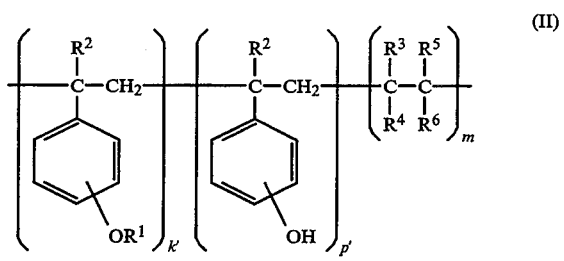

are those having a tert-butyl group, a tetrahydropyranyl group or a trimethylsilyl group as $R^1$; a hydrogen atom or a cyano group as $R^4$; a cyano group or a tert-butoxycarbonyl group as $R^6$; and a hydrogen atom as $R^2$, $R^3$ and $R^5$.

Concrete examples of the polymer are as follows.
p-isopropoxystyrene-p-hydroxystyrene polymer,
m-isopropoxystyrene-m- or p-hydroxystyrene polymer,
p-tetrahydropyranyloxystyrene-p-hydroxystyrene polymer,
m-tetrahydropyranyloxystyrene-m- or p-hydroxystyrene polymer,
p-tert-butoxystyrene-p-hydroxystyrene polymer,
m-tert-butoxystyrene-m- or p-hydroxystyrene polymer,
p-trimethylsilyloxystyrene-p-hydroxystyrene polymer,
m-trimethylsilyloxystyrene-m- or p-hydroxystyrene polymer,
p-tert-butoxycarbonyloxystyrene-p-hydroxystyrene polymer,
m-tert-butoxycarbonyloxystyrene-m- or p-hydroxystyrene polymer,
p-methoxy-α-methylstyrene-p-hydroxy-α-methylstyrene polymer,
m-methoxy-α-methylstyrene-m- or p-hydroxy-α-methylstyrene polymer,
p-tert-butoxycarbonyloxystyrene-p-hydroxystyrene-methyl methacrylate polymer,
m-tert-butoxycarbonyloxystyrene-m- or p-hydroxystyrene-methyl methacrylate polymer,
p-tetrahydroxypyranyloxystyrene-p-hydroxystyrene-tert-butyl methacrylate polymer,
m-tetrahydroxypyranyloxystyrene-m- or p-hydroxystyrene-tert-butyl methacrylate polymer,
p-tert-butoxystyrene-p-hydroxystyrene-fumaronitrile polymer,
m-tert-butoxystyrene-m- or p-hydroxystyrenefumaronitrile polymer,
p-trimethylsilyloxystyrene-p-hydroxystyrene-p-chlorostyrene polymer, m-trimethylsilyloxystyrene-m- or p-hydroxystyrene-p-chlorostyrene polymer,
p-tert-butoxystyrene-p-hydroxystyrene-tertbutyl methacrylate polymer,
m-tert-butoxystyrene-m- or p-hydroxystyrene-tert-butyl methacrylate polymer,
p-tert-butoxystyrene-p-hydroxystyrene-acrylonitrile polymer,
m-tert-butoxystyrene-m- or p-hydroxystyreneacrylonitrile polymer,
p-tert-butoxystyrene-p-hydroxystyrene-tertbutyl-p-ethenylphenoxyacetate polymer,
m-tert-butoxystyrene-m- or p-hydroxystyrene-tert-butyl p-ethenylphenoxyacetate polymer, etc.

These polymers can be prepared by the following processes 1 to 3.

Process 1

A monomer having the special functional group alone, and if necessary together with a third monomer, is polymerized according to a conventional method, e.g. in an organic solvent in the presence of a radical polymerization initiator in a stream of nitrogen or argon at 50° C. to 110° C. for 1 to 10 hours. As the organic solvent, there can be used benzene, toluene, tetrahydrofuran, 1,4-dioxane, etc. As the radical polymerization initiator, there can be used azo series polymerization initiators such as 2,2'-azobisisobutyronitrile, 2,2'-azobis(2,4-dimethylvaleronitrile), 2,2'-azobis (methyl 2-methylpropionate), etc.; peroxide series polymerization initiators such as benzoyl peroxide, lauroyl peroxide, etc.

After the polymerization, the resulting polymer having the monomer unit having the special functional group alone or together with the third monomer unit (copolymer) is isolated by a conventional method. Then, the isolated polymer or copolymer is reacted with an acid in an organic solvent at 30° to 100° C. for 1 to 10 hours to eliminate the special functional group at optional proportions.

As the organic solvent, there can be used tetrahydrofuran, acetone, 1,4-dioxane, etc. As the acid, there can be used protonic acid such as sulfuric acid, phosphoric acid, hydrochloric acid, hydrobromic acid, p-toluenesulfonic acid, etc. After the reaction, the resulting polymer is after-treated by a conventional method to isolate the desired polymer.

For example, a monomer of the formula:

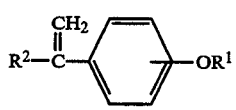

(IV)

wherein $R^1$ and $R^2$ are as defined above, is polymerized, followed by elimination of $R^1$ at predetermined proportion using a suitable acid to obtain the polymer of the formula (I).

The polymer of the formula (I) can also be obtained by polymerizing p-tert-butoxystyrene and eliminating $R^1$ at predetermined proportion using a suitable acid.

On the other hand, the polymer of the formula (II) can be obtained by copolymerizing a monomer of the formula (IV) and a monomer of the formula:

(V)

wherein $R^3$ to $R^6$ are as defined above, and eliminating $R^1$ at predetermined proportion using a suitable acid.

The polymer of the formula (II) can also be obtained by copolymerizing p-tert-butoxystyrene and a monomer of the formula (V), and eliminating $R^1$ at predetermined proportion using a suitable acid.

Process 2

A monomer having the special functional group, p-hydroxystyrene (or p-hydroxy-α-methylstyrene), and if necessary a third monomer are copolymerized in the same manner as described in Process 1, after-treated by a conventional method to isolate the desired polymer.

Process 3 p-Hydroxystyrene (or p-hydroxy-α-methylstyrene) alone, or if necessary together with a third monomer, is polymerized or copolymerized in the same manner as described in Process 1. The resulting polymer or copolymer is subjected to chemical introduction of the special functional group in an optional proportion and after-treated by a conventional method to isolate the desired polymer.

The polymer used in the present invention can be obtained by any one of the above-mentioned three processes. Among these processes, Process 1 is more preferable, since the polymer obtained by Process 1 is remarkably excellent in transmittance for light of near 248.4 nm compared with the polymers obtained by Processes 2 and 3.

This is explained in detail referring to a typical polymer of poly(p-tert-butoxystyrene-p-hydroxystyrene) represented by the formula (I).

Poly(p-tert-butoxystyrene-p-hydroxystyrene) obtained by Process 1 and poly(p-tert-butoxystyrene-p-hydroxystyrene)s obtained by Processes 2 and 3 (proportion of individual monomer units being 1:1) were film formed to give films of 1 μm thick. Using these films, the transmittance for light of 248.4 nm was measured. The transmittance of the polymer obtained by Process 1 was about 70%, and the polymers obtained by Processes 2 and 3 were about 55 to 61%.

When the resist material is used for photolithography of ultrafine processing, high transmittance for light is important.

It is preferable that the polymer has the weight average molecular weight ($\overline{Mw}$) of about 1000 to 40,000 in terms of polystyrene measured by GPC method. More preferable weight average molecular weight ($\overline{Mw}$) is about 3000 to 20,000.

As the photoacid generator (b), there can be used photosensitive compounds which can generate an acid by exposure to light and do not adversely affecting the formation of a photoresist pattern.

Particularly preferable photoacid generators are as follows:

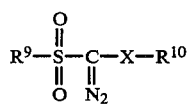  (VI)

wherein $R^9$ and $R^{10}$ are independently a straight-chain, branched or cyclic alkyl group having 1 to 10 carbon atoms, a haloalkyl group having 1 to 10 carbon atoms, or a group of the formula:

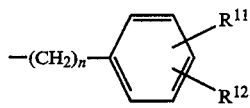  (VII)

wherein $R^{11}$ and $R^{12}$ are independently a hydrogen atom, a lower alkyl group having 1 to 5 carbon atoms, a haloalkyl group having 1 to 5 carbon atoms; n is zero or an integer of 1 or more; and X is a carbonyl group, a carbonyloxy group or a sulfonyl group:

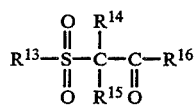  (XI)

wherein $R^{13}$ is a straight-chain, branched or cyclic alkyl group having 1 to 10 carbon atoms, a trifluoromethyl group, or a group of the formula:

  (XII)

wherein $R^{17}$ is a hydrogen atom or a methyl group; $R^{14}$ and $R^{15}$ are independently a hydrogen atom, or a lower alkyl group having 1 to 5 carbon atoms; and $R^{16}$ is a straight-chain, branched or cyclic alkyl group having 1 to 10 carbon atoms, preferably 3 to 6 carbon atoms, a phenyl group, a halogen-substituted phenyl group, an alkyl-substituted phenyl group, an alkoxy-substituted phenyl group, or an alkylthio-substituted phenyl group:

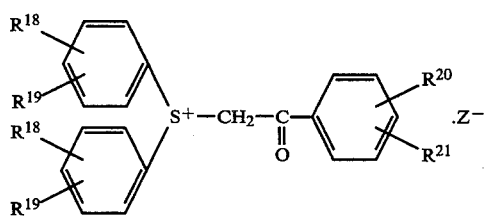  (XIII)

wherein $R^{18}$, $R^{19}$, $R^{20}$ and $R^{21}$ are independently a hydrogen atom, a halogen atom, a straight-chain, branched or cyclic alkyl group having 1 to 10 carbon atoms, or an alkoxy group having 1 to 10 carbon atoms; $Z^-$ is a perchlorate ion, a p-toluenesulfonate ion or a trifluoromethanesulfonate ion:

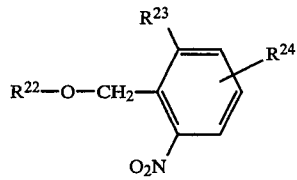  (XIV)

wherein $R^{22}$ is a trichloroacetyl group, a p-toluenesulfonyl group, a p-trifluoromethylbenzenesulfonyl group, a methanesulfonyl group or a trifluoromethanesulfonyl group; $R^{23}$ and $R^{24}$ are independently a hydrogen atom, a halogen atom, or a nitro group.

Preferable examples of the compound of the formula (VI) are as follows:

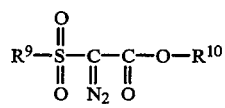  (VIII)

wherein $R^9$ and $R^{10}$ are as defined above.

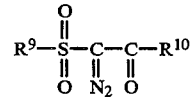  (IX)

wherein $R^9$ and $R^{10}$ are as defined above.

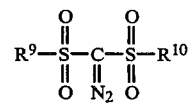  (X)

Concrete examples of the photoacid generator are as follows.
bis(p-toluenesulfonyl)diazomethane,
1-p-toluenesulfonyl-1-methanesulfonyldiazomethane,
bis(isopropylsulfonyl)diazomethane,
bis(cyclohexylsulfonyl)diazomethane,
1-cyclohexylsulfonyl-1-tert-butylsulfonyldiazomethane,
1-p-toluenesulfonyl-1-cyclohexylcarbonyldiazomethane,
2-methyl-2-p-toluenesulfonylpropiophenone,
2-methanesulfonyl-2-methyl-(4-methylthio)propiophenone,
2,4-dimethyl-2-(p-toluenesulfonyl)pentane-3-one,
2-(cyclohexylcarbonyl)-2-(p-toluenesulfonyl)propane,
diphenyl-p-methylphenacylsulfonium perchlorate,
diphenyl-2,5-dimethoxyphenacylsulfonium p-toluenesulfonate,
2-nitrobenzyl p-toluenesulfonate,
2,6-dinitrobenzyl trichloroacetate,
2,4-dinitrobenzyl p-trifluoromethylbenzenesulfonate, etc.

As the solvent (c), there can be used those which can dissolve both the polymer (a) and the photoacid generator (b), and preferably have no absorption at near 230 to 300 nm.

Concrete examples of the solvent are methyl Cellosolve acetate, ethyl Cellosolve acetate, propylene glycol monoethyl ether acetate, methyl lactate, ethyl lactate, 2-ethoxyethyl lactate, methyl pyruvate, ethyl pyruvate, methyl 3-methoxypropionate, ethyl 3-methoxypropionate, N-methyl-2-pyrrolidone, cyclohexanone, methyl ethyl ketone, 1,4-dioxane, ethylene glycol monoisopropyl ether, diethylene glycol monomethyl ether, diethylene glycol dimethyl ether, etc.

The resist material of the present invention may further contain one or more dyes, surface active agents, and the like.

Pattern formation using the resist material of the present invention can be carried out as follows.

The resist material of the present invention is coated on a substrate such as a silicon wafer so as to make the film thickness about 0.5 to 2 μm (in the case of forming the top layer among three layers, the film thickness being about 0.1 to 0.5 μm), and prebaked at 70° to 130° C. for 10 to 30 minutes in an oven or at 70° to 130° C. for 1 to 2 minutes on a hot plate. Then, a mask is formed on the resulting resist film for forming the desired pattern, and exposed to deep UV light of 300 nm or less at an exposure dose of about 1 to 100 mJ/cm². Development is carried out by a conventional method such as a dipping method, a puddle method, a spray method, etc., using a developing solution such as an aqueous solution of 0.1 to 5% tetramethylammonium hydoxide (TMAH) for 0.5 to 3 minutes to obtain the desired pattern on the substrate.

Mixing ratio of the polymer (a) and the photoacid generator (b) in the positive tone resist material is 1 to 20 parts by weight, preferably 1 to 10 parts by weight, of the photoacid generator (b) per 100 parts by weight of the polymer (a).

The solvent is used preferably in an amount of 100 to 2000 parts by weight, more preferably 150 to 600 parts by weight per 100 parts by weight of the polymer (a).

The developing solution used for forming various pattern forming methods is selected from alkali solutions with suitable concentrations so as almost not to dissolve non-exposed portions and so as to dissolve exposed portions depending on the solubility for the alkali solutions of the resin (polymer) used in the resist material. The concentration of alkali solutions is usually 0.01 to 20% by weight. As the alkali solutions, there can be used aqueous solutions of organic amines such as TMAH, choline, triethanolamine, etc., inorganic alkalis such as NaOH, KOH, etc.

Since the polymer used in the resist material contains an hydroxystyrene skeleton in its component, the resist material is excellent in heat resistance, resistance to dry etching and adhesiveness to the substrate. Further when the polymer is produced by Process 1, it has remarkably excellent transmittance for light of near 248.4 nm compared with the polymers produced by Processes 2 and 3.

The resist material of the present invention can generate an acid by not only KrF excimer laser light but also electron beams and X-rays to cause chemical amplifying action.

Therefore, the resist material of the present invention can form patterns by using deep UV light and KrF excimer laser light with a low exposure dose or by an irradiation method using electron beams and X-rays, while applying chemical amplifying action of the resist material.

More concretely, when the resist material film is exposed to KrF excimer laser light, deep UV light, etc., exposed portions generate an acid by photo reaction as shown below:

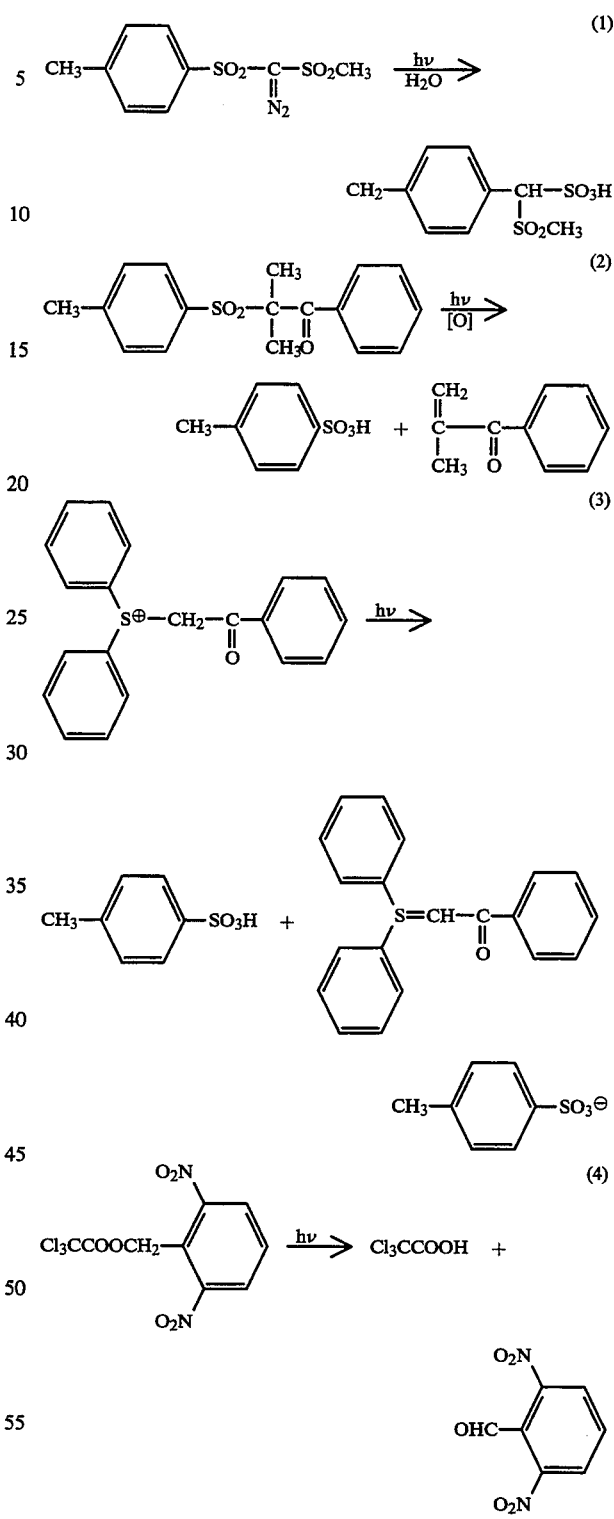

When heat treatment is carried out subsequent to the exposure step, the special functional group (e.g. a tert-butoxy group in the reaction equation (5)) of the polymer is chemically changed to a hydroxyl group by the action of the acid, and becomes alkali-soluble and releases into the developing solution at the time of development.

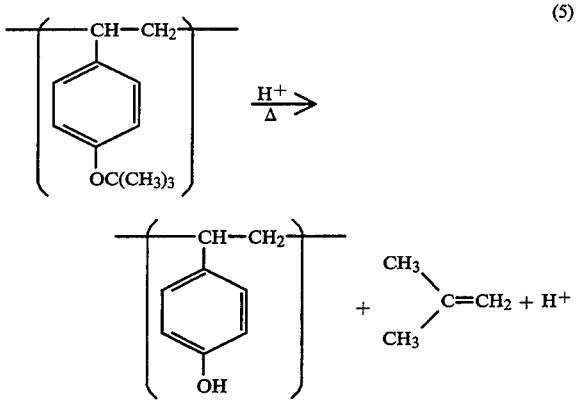

On the other hand, since no acid is generated on non-exposed portions, no chemical change takes place by the heat treatment. Instead, the photoacid generator acts so as to protect the hydrophilic moieties of the polymer used for improving adhesiveness to the substrate from wetting by the alkali developing solution.

As mentioned above, when the pattern is formed by using the resist material of the present invention, since a large difference in solubility in the alkali developing solution takes place between the exposed portions and non-exposed portions and the resin (polymer) in the non-exposed portions has strong adhesiveness to the substrate, no peeling of the resist material film takes place at the time of development, resulting in forming positive tone pattern with good contrast. Further, as shown in the reaction equation (5), since the acid generated by exposure to light acts catalytically, the exposure to light can be limited to generating a necessary amount of acid, resulting in making the reduction of the amount of the exposure energy possible.

The present invention is illustrated by way of the following examples.

SYNTHESIS EXAMPLE 1

Synthesis of poly(p-tert-butoxystyrene-p-hydroxystyrene)

(1) Free radical polymerization of p-tert-butoxystyrene

A solution of p-tert-butoxystyrene (17.6 g) in toluene containing a catalytic amount of 2,2′-azobisisobutyronitrile (AIBN) was heated at 80° C. for 6 hours under nitrogen. After cooling, the reaction mixture was poured into methanol and the polymer was precipitated. The polymer was filtered, washed with methanol and dried under reduced pressure to afford 15.5 g of poly(p-tert-butoxystyrene) as a white powder having $\overline{Mw}$ 10000 (GPC with polystyrene calibration).

(2) Synthesis of poly(p-tert-butoxystyrene-p-hydroxystyrene)

A solution of poly(p-tert-butoxystyrene) (15.0 g) obtained in above (1) and hydrochloric acid (10 ml) in 1,4-dioxane was refluxed for 1.5 hours with stirring. The mixture was cooled, poured into H$_2$O and the white solid was precipitated. The polymer was filtered, washed and dried under reduced pressure to afford 11.8 g of the title compound as a white powder having $\overline{Mw}$ 10000 (GPC with polystyrene calibration). The composition of the polymer was found to be p-tert-butoxystyrene and p-hydroxystyrene in a molar ratio of ca 1:1 based on $^1$HNMR analysis.

SYNTHESIS EXAMPLE 2

Synthesis of poly(p-tert-butoxystyrene-p-hydroxystyrene-tert-butyl methacrylate)

(1) Free radical polymerization of p-tert-butoxystyrene

A solution of p-tert-butoxystyrene (28.2 g, 0.16 mole) and tert-butyl methacrylate (5.7 g, 0.04 mole) in toluene containing a catalytic amount of 2,2′-azobis(2,4-dimethylvaleronitrile) was heated at 80° C. for 8 hours under nitrogen. After cooling, the reaction mixture was poured into petroleum ether and the polymer was precipitated. The polymer was filtered, washed with petroleum ether and dried under reduced pressure to give 23.8 g of poly(p-tert-butoxystyrene-tert-butyl methacrylate) as a white powder.

(2) Synthesis of poly(p-tert-butoxystyrene-p-hydroxystyrene-tert-butyl methacrylate)

A solution of poly(p-tert-butoxystyrene-tertbutyl methacrylate) (23.5 g) obtained in above (1) and p-toluenesulfonic acid (2 g) in 1,4-dioxane was refluxed for 1.5 hours with stirring. The mixture was cooled, poured into H$_2$O and the polymer was precipitated. The polymer was filtered, washed with H$_2$O and dried under reduced pressure to afford 14.1 g of the title compound as a white powder having $\overline{Mw}$ 15000 (GPC with polystyrene calibration). $^1$HNMR analysis indicated that 60% of p-tert-butoxy group was converted into p-hydroxy group.

SYNTHESIS EXAMPLE 3

Synthesis of poly(p-tert-butoxystyrene-p-hydroxystyrene)

Using p-tert-butoxystyrene (3.5 g, 0.02 mole) and p-hydroxystyrene (2.7 g, 0.02 mole), free radical polymerization was carried out in the same manner as described in Synthesis Example 1. Then, the reaction mixture was poured into petroleum ether, and the precipitate was filtered, washed and dried in vacuo to give 5.0 g of the title compound as a white powder having $\overline{Mw}$ 10000 (GPC with polystyrene calibration). The composition of the polymer was found to be p-tert-butoxystyrene and p-hydroxystyrene in a molar ratio of ca. 1:1 based on $^1$HNMR analysis.

SYNTHESIS EXAMPLE 4

Synthesis of poly(p-tert-butoxystyrene-p-hydroxystyrene)

(1) Free radical polymerization of p-hydroxystyrene

Using p-hydroxystyrene (5.0 g), the free radial polymerization was carried out in the same manner as described in Synthesis Example 1. Then the precipitate was filtered by suction, washed and dried under reduced pressure to afford 4.2 g of poly(p-hydroxystyrene) as a white powder.

(2) Synthesis of poly(p-tert-butoxystyrene-p-hydroxystyrene)

To a solution of poly(p-hydroxystyrene) (4.0 g) obtained in above (1) in dimethoxyethane (70 ml) in a pressure vessel, isobutyrene (60 g) and conc. sulfuric acid (0.3 ml) were added at −60° C. or lower, the mixture was brought to 45° C. for 1 hour with stirring, and then stirring was continued at room temperature for 22 hours. After reaction, the mixture was evaporated, the residue was neutralized by addition of sodium carbonate and poured into H$_2$O. The precipitate was filtered by suction, washed with H$_2$O and dried under reduced pressure to give 4.1 g of poly(p-tert-butoxystyrene-p-hydroxystyrene) as a white powder having $\overline{\text{Mw}}$ 10000 (GPC with polystyrene calibration). The composition of the polymer was found to be p-tert-butoxystyrene and p-hydroxystyrene in a molar ratio of ca. 1:1 based on $^1$HNMR analysis.

SYNTHESIS EXAMPLE 5

Synthesis of poly(p-tert-butoxystyrene-p-hydroxystyrene-fumaronitrile)

(1) Free radical polymerization of p-tert-butoxystyrene and fumaronitrile

A solution of p-tert-butoxystyrene (28.2 g, 0.16 mole) and fumaronitrile (3.1 g, 0.04 mole) in toluene containing a catalytic amount of 2,2'-azobis(methyl 2-methyl propionate) was heated at 90° C. for 2 hours under nitrogen. After reaction, the reaction solution was poured into methanol and polymer was precipitated. The polymer was filtered, washed and dried in vacuo to give 21.3 g of poly(p-tert-butoxystyrene-fumaronitrile) as a white powder.

(2) Synthesis of poly(p-tert-butoxystyrene-p-hydroxystyrene-fumaronitrile

Using poly(p-tert-butoxystyrene-fumaronitrile) (20.0 g) obtained in above (1), the reaction was carried out in the same manner as described in Synthesis Example 1, (2) to afford 15.4 g of the title compound as a white powder having $\overline{\text{Mw}}$ 12000 (GPC with polystyrene calibration). $^1$HNMR analysis indicated that 50% of p-tert-butoxy group was converted into p-hydroxy group.

SYNTHESIS EXAMPLE 6

Synthesis of poly(p-tert-butoxycarbonyloxystyrene-p-hydroxystyrene)

(1) Free radical polymerization of p-tert-butoxycarbonyloxystyrene

A solution of p-tert-butoxycarbonyloxystyrene (22 g, 0.1 mole) obtained by the method of U.S. Pat. No. 4,491,628 (1985) in toluene containing catalytic amount of 2,2'-azobis(2,4-dimethylvaleronitrile) was heated at 90° C. for 5 hours under a stream of N$_2$. The reaction mixture was treated in the same manner as described in Synthesis Example 1(1) to give 15.2 g of poly(p-tert-butoxycarbonyloxystyrene) as a white powder having $\overline{\text{Mw}}$ 12000 (GPC with polystyrene calibration).

(2) Synthesis of poly(p-tert-butoxycarbonyloxystyrene-p-hydroxystyrene)

Using poly(p-tert-butoxycarbonyloxystyrene) (7 g), the reaction was carried out in the same manner as described in Synthesis Example 1, (2), to give 4.8 g of the title compound as a white powder. The composition of the polymer was found to be p-tert-butoxycarbonyloxystyrene and p-hydroxystyrene in a molar ratio of ca. 1:1 based on $^1$HNMR analysis.

SYNTHESIS EXAMPLE 7

Synthesis of poly(p-tetrahydropyranyloxystyrene-p-hydroxystyrene)

To a solution of poly(p-hydroxystyrene) [$\overline{\text{Mw}}$ 12000: GPC] (9 g) in dimethoxyethane (100 ml), 3,4-dihydro-2H-pyran (12.6 g) and conc. sulfuric acid (0.5 ml) were added, followed by reaction at 30°–40° C. for 15 hours with stirring. After reaction, the mixture was evaporated, the residue was neutralized by addition of sodium carbonate and poured into H$_2$O. The precipitate was filtered by suction, washed with H$_2$O and dried under reduced pressure to give 11.0 g of the title compound as a white powder. The composition of the polymer was found to be p-tetrahydropyranyloxystyrene and p-hydroxystyrene in a molar ratio of ca. 3:7 based on $^1$HNMR analysis.

SYNTHESIS EXAMPLE 8

Synthesis of poly(p-tert-butoxystyrene-p-hydroxystyrene-methyl methacrylate)

(1) Free radical polymerization of p-tert-butoxystyrene and methyl methacrylate

A solution of p-tert-butoxystyrene (15.8 g, 0.09 mole) and methyl methacrylate (1.0 g, 0.09 mole) in toluene containing a catalytic amount of 2,2'-azobis(2,4-dimethylvaleronitrile) was heated at 80° C. for 8 hours under nitrogen. After cooling, the reaction mixture was poured into petroleum ether and polymer was precipitated. The polymer was filtered by suction, washed with petroleum ether and dried in vacuo to give 10.9 g of poly(p-tertbutoxystyrene-methyl methacrylate) as a white powder.

(2) Synthesis of poly(p-tert-butoxystyrene-p-hydroxystyrene-methyl methacrylate)

A solution of poly(p-tert-butoxystyrene-methyl methacrylate) (10.5 g) obtained in above (1) and p-toluenesulfonic acid (1 g) in 1,4-dioxane was refluxed for 1.5 hours with stirring. After cooling, the mixture was poured into H$_2$O, the precipitate was filtered, washed with H$_2$O and dried under reduced pressure to afford 7.1 g of the title compound as a white powder having $\overline{\text{Mw}}$ 15000 (GPC with polystyrene calibration). $^1$HNMR analysis indicated that 60% of p-tert-butoxy group was converted into p-hydroxy group.

SYNTHESIS EXAMPLE 9

Synthesis of 2-cyclohexylcarbonyl-2-(p-toluenesulfonyl)propane (1) Synthesis of 1-cyclohexyl-2-methyl-1-propanone To a suspension of magnesium turnings (23.9 g, 0.98 atom) in dry ethyl ether, cyclohexylbromide (160 g, 0.98 mole) was added dropwise under mild reflux, followed by reaction with stirring for 1 hour under reflux to afford a Grignard reagent. After cooling the, Grignard reagent was added dropwise to a solution of isobutyloyl chloride (95 g, 0.89 mole) in dry ethyl ether at −5° to 0° C., the resultant mixture was stirred at the same temperature for 3 hours and allowed to stand at room temperature overnight. The reaction mixture was poured into H$_2$O, and the organic layer was separated, washed with H$_2$O, dried over anhydrous MgSO$_4$ and evaporated. The residue was distilled under reduced pressure to give 50 g of 1-cyclohexyl-2-methyl-1-propanone as a pale yellow oil having a boiling point of 95°–100° C./20 mmHg.

$^1$NHMR δppm (CDCl$_3$): 1.06(6H, d, C$\underline{H}_3$x2), 1.12–1.87(10H, m, cyclohexylic C$\underline{H}_2$x5), 2.51(1$\underline{H}$, m, cyclohexylic C$\underline{H}$), 2.76(1H, m, C$\underline{H}$).

IR(neat) νcm$^{-1}$: 1710(C=O).

(2) Synthesis of 2-chloro-1-cyclohexyl-2-methyl-1-propanone

To 1-cyclohexyl-2-methyl-1-propanone (47.6 g, 0.31 mole) obtained in above (1), sulfuryl chloride (42 g, 0.31 mole) was added dropwise at 25°–35° C., and the mixture was stirred at 50° C. for 3.5 hours and then evaporated. The resultant residue was distilled under reduced pressure to give 30.1 g of 2-chloro-1-cyclohexyl-2-methyl-1-propanone as a yellow oil.

bp. 99°–105° C./18 mmHg.

$^1$HNMR δppm (CDCl$_3$): 1.18–1.87(16H, m, C$\underline{H}_3$x2 and cyclohexylic C$\underline{H}_2$x5), 3.13(1H, m, cyclohexylic C$\underline{H}$).

(3) Synthesis of 2-cyclohexylcarbonyl-2-(p-toluenesulfonyl)propane

A solution of 2-chloro-1-cyclohexyl-2-methyl-1-propanone (30.0 g, 0.16 mole) and sodium p-toluenesulfonate (30.0 g, 0.17 mole) in dimethylsulfoxide was reacted with stirring at 60° C. for 20 hours. The reaction mixture was poured into cold H$_2$O, and stirred at 0°–5° C. for 1 hour. The precipitate was filtered, washed with H$_2$O and dried. The crude solid (18 g) was recrystallized from n-hexane/benzene to give 13.5 g of 2-cyclohexylcarbonyl-2-(p-toluenesulfonyl)propane as white needles.

m.p. 123°–123.5° C.

$^1$NMR δppm (CDCl$_3$): 1.19–1.91(16H, m, C$\underline{H}_3$x2 and cyclohexylic C$\underline{H}_2$x5), 2.45(3H, s, Ar-C$\underline{H}_3$), 3.25(1H, m, cyclohexylic C$\underline{H}$), 7.33(2H, d, J=8Hz, Ar 3-H, 5-H), 7.65(2H, d, J=8Hz, Ar 2-H, 6-H).

IR(KBr-disk) νcm$^{-1}$: 1705 (C=O), 1310.

SYNTHESIS EXAMPLE 10

Synthesis of bis(cyclohexylsulfonyl)diazomethane (1) Synthesis of p-toluenesulfonylazide After dissolving sodium azide (22.5 g, 0.35 mole) in a small amount of H$_2$O, the resulting solution was diluted with a 90% ethanol aqueous solution (130 ml). To this, an ethanol solution dissolving p-toluenesulfonyl chloride (60 g, 0.32 mole) was added dropwise at 10°–25° C., followed by reaction at room temperature for 2.5 hours. The reaction solution was concentrated at room temperature under reduced pressure. The resulting oily residue was washed with H$_2$O several times and dried over anhydrous MgSO$_4$. After removing the drying agent by filtration, there was obtained 50.7 g of the title compound as a colorless oil.

$^1$HNMR δppm (CDCl$_3$): 2.43(3H, s, C$\underline{H}_3$), 7.24(2H, d, J=8Hz, Ar 3-H, 5-H), 7.67(2H, d, J=8Hz, Ar 2-H, 6-H).

IR (Neat) νcm$^{-1}$: 2120 (—N$_3$).

(2) Synthesis of bis(cyclohexylsulfonyl)methane

To cyclohexylthiol (20.2 g, 0.17 mole), an ethanol solution dissolving pottasium hydroxide (12.0 g, 0.21 mole) was added dropwise at room temperature and mixture was stirred at 30°±5° C. for 30 minutes. Then methylene chloride (18.2 g, 2.14 mole) was added to this mixture and reacted with stirring at 50°±5° C. for 6 hours. After standing at room temperature overnight, the reaction mixture was diluted with ethanol (55 ml) and sodium tungstate (0.4 g), 30% hydrogen peroxide (50 g, 0.44 mole) was added dropwise to this solution at 45°–50° C., reacted with stirring for 4 hours at the same temperature, then added and H$_2$O (200 ml) and the mixture was allowed to stand overnight at room temperature. The precipitate was filtered, washed with H$_2$O and dried. The resultant solid was recrystallized from ethanol to give 15.5 g of bis(cyclohexylsulfonyl)methane as white needles.

m.p. 137°–139° C.

$^1$HNMR δppm (CDCl$_3$): 1.13–2.24(20H, m, cyclohexylic C$\underline{H}_2$x10), 3.52–3.66(2H, m, cyclohexylic C$\underline{H}$x2), 4.39(2$\underline{H}$, s, C$\underline{H}_2$).

IR (KBr-disk) νcm$^-$: 1320, 1305.

(3) Synthesis of bis(cyclohexylsulfonyl)diazomethane

To a solution of sodium hydroxide (1.7 g) in a 60% ethanol aqueous solution (70 ml), bis(cyclohexylsulfonyl)methane (12.1 g, 0.04 mole) obtained in above (2) was added, then an ethanol solution of p-toluenesulfonyl azide (8.2 g, 0.04 mole) obtained in above (1) was added dropwise at 5°–10° C., followed by the reaction at room temperature for 7 hours. After standing at room temperature overnight, the precipitate was filtered, washed with ethanol and dried. The resultant solid was recrystallized from acetonitrile to give 8.0 g of bis(cyclohexylsulfonyl)diazomethane as pale yellow prisms.

m.p. 130°–131 ° C.

$^1$HNMR δppm (CDCl$_3$): 1.13–2.25(20H, m, cyclohexylic C$\underline{H}_2$x10), 3.36–3.52(2H, m, cyclohexylic C$\underline{H}$x2).

IR (KBr-disk) νcm$^{-1}$: 2130(CN$_2$), 1340, 1320.

SYNTHESIS EXAMPLE 11

Synthesis of 2,6-dinitrobenzyl p-toluenesulfonate (1) Synthesis of 2,6-dinitrobenzylalcohol To a suspension of 2,6-dinitrobenzaldehyde (19.6 g, 0.1 mole) in methanol (200 ml), sodium borohydride (5.8 g) was added in a small portion at 15°–25° C., the resultant mixture was stirred at room temperature for 1 hour and then concentrated. To the residue, H$_2$O (100 ml) and chloroform (100 ml) were added, followed to by stirring for 1 hour, the chloroform layer was separated, washed with H$_2$O, dried over anhydrous MgSO$_4$ and evaporated to afford 15.0 g of 2,6-dinitrobenzyl alcohol as yellow crystals.

m.p. 92.5°–93.5° C.

$^1$HNMR δppm (CDCl$_3$): 2.77(1H, t, J=7Hz, O$\underline{H}$), 4.97(2H, d, J=7Hz, C$\underline{H}_2$), 7.66(1H, t, J=8Hz, Ar 4-$\underline{H}$), 8.08(2H, t, J=8Hz, Ar 3-H, 5-H).

(2) Synthesis of 2,6-dinitrobenzyl p-toluenesulfonate

To a solution of 2,6-dinitrobenzylalcohol (14.9 g, 0.075 mole) obtained in above (1) and p-toluenesulfonyl chloride (15.7 g, 0.083 mole) in acetone (150 ml), a solution of dicyclohexylamine (15 g) in acetone was added dropwise at 0°–10° C., stirring was continued for 4 hours at room temperature, the precipitate was filtered off and the filtrate was evaporated. The residue (29 g) was recrystallized from carbon tetrachloride to give 19.8 g of 2,6-dinitrobenzyl p-toluenesulfonate as pale yellow leaflets.

m.p. 98°–99° C.

$^1$HNMR δppm (CDCl$_3$): 2.45(3H, s, CH$_3$), 5.57(2H, s, CH$_2$), 7.34(2H, d, J=8Hz, p-Me-Ar 3-H, 5-H, 7.68(1H, t, J=8Hz, 2.6-(NO$_2$)$_2$-Ar 4-H), 7.72(2H, d, J=8Hz, p-Me-Ar 2-H, 6-H), 8.06(2H, d, J=8Hz, 2.6-(NO$_2$)$_2$-Ar 3-H, 5-H).

IR (KBr-disk) νcm$^{-1}$: 1360, 1170.

SYNTHESIS EXAMPLE 12

Synthesis of 2-methyl-2-(p-toluenesulfonyl)propiophenone

Using isobutyrophenone, the reaction was carried out in the same manner as described in Synthesis Example 9, (2) and (3), the crude solid was recrystallized from methanol to afford 2-methyl-2-(p-toluenesulfonyl)-propiophenone as a white needles.

m.p. 64°–64.5° C.

$^1$HNMR νppm (CDCl$_3$): 1.70(6H, s, CH$_3$x2), 2.45(3H, s, Ar-CH$_3$), 7.32(2H, d, J=7Hz, p-Me-Ar 3-H, 5-H), 7.44(2H, t, J=7Hz, Ar 3-H, 5-H), 7.54(1H, t, J=7Hz, Ar 4-H), 7.67(2H, d, J=7Hz, p-Me-Ar 2-H, 6-H), 7.95(2H, d, J=7Hz, Ar 2-H, 6-H).

IR (KBr-disk) νcm$^{-1}$: 1680(C=O), 1303, 1290.

SYNTHESIS EXAMPLE 13

Synthesis of 2,4-dimethyl-2-(p-toluenesulfonyl)-pentan-3-one

Using diisopropylketone, the reaction was carried out in the same manner as described in Synthesis Example 9, (2) and (3). The crude solid was recrystallized from n-hexane/benzene to afford 2,4-dimethyl-2-(p-toluenesulfonyl)pentan-3-one as white leaflets.

m.p. 76°–79° C.

$^1$HNMR δppm (CDCl$_3$): 1.15(6H, d, CH$_3$x2), 1.55(6H, s, CH$_3$x2), 2.45(3H, s, Ar-CH$_3$), 3.54(1H, m, J=7Hz, CH), 7.34(2H, d, J=8Hz, Ar 3-H, 5-H), 7.65(2H, d, J=8Hz, Ar 2-H, 6-H).

IR (KBr-DISK) νcm$^{-1}$: 1715(C=O), 1305, 1290.

SYNTHESIS EXAMPLE 14

Synthesis of methylsulfonyl p-toluenesulfonyldiazomethane (1) Synthesis of methylsulfonyl p-toluenesulfonylmethane To a solution of methylthiomethyl p-tolylsulfone (6.0 g, 0.03 mole) and sodium tungstate (0.06 g) in methanol (40 ml) and H$_2$O (4 ml), 30% hydrogen peroxide (6.8 g, 0.06 mole) was added dropwise at 45°–50° C., reacted with stirring for 10 hours under reflux, and allowed to stand at room temperature overnight. The reaction mixture was poured into H$_2$O (400 ml), and the precipitate was filtered, washed with H$_2$O and dried. The crude solid (7.2 g) was recrystallized from ethanol to give 6.1 g of methylsulfonyl p-toluenesulfonylmethane as white needles.

m.p. 163.5°–165° C.

$^1$HNMR δppm (CDCl$_3$): 2.48(3H, s, Ar-CH$_3$), 3.28(3H, s, CH$_3$), 4.56(2H, s, CH$_2$), 7.40(2H, d, J=8Hz, Ar 3-H, 5-H), 7.87(2H, d, J=8Hz, Ar 2-H, 6-H).

(2) Synthesis of methylsulfonyl p-toluenesulfonyldiazomethane

Using methylsulfonyl p-toluenesulfonylmethane (5.0 g, 0.02 mole) obtained in above (1), the reaction was carried out in the same manner as described in Synthesis Example 10, (3), and the crude solid (3 g) was recrystallized from ethanol to give 2.2 g of methylsulfonyl p-toleuensulfonyldiazomethane as pale yellow leaflets.

m.p. 107.5°–109° C.

$^1$HNMR δppm (CDCl$_3$): 2.46(3H, s, Ar-CH$_3$), 3.42(3H, s, CH$_3$), 7.38(2H, d, J=8Hz, Ar 3-H, 5-H), 7.87 (2H, d, J=8Hz, Ar 2-H, 6-H).

IR (KBr-disk) νcm$^{-1}$: 2120(CN$_2$), 1350, 1330.

SYNTHESIS EXAMPLE 15

Synthesis of 1-diazo-1-methylsulfonyl-4-phenylbutan-2-one (1) Synthesis of methyl 3-phenylpropionate A solution of 3-phenylpropionic acid (50 g, 0.33 mole) and conc. sulfuric acid (5 g) in methanol (220 ml) was refluxed for 1 hour with the stirring, concentrated and poured into cold H$_2$O. The mixture was extracted with methylene chloride (75 ml×3), the organic layer was washed with H$_2$O (125 ml×2), dried over anhydrous MgSO$_4$ and evaporated. The residue (54 g) was distilled under reduced pressure to give 51.5 g of methyl 3-phenylpropionate as a colorless oil.

bp. 94°–95° C./5 mmHg.

IR (Neat) νcm$^{-1}$: 1745 (COO).

(2) Synthesis of 1-methylsulfonyl-4-phenylbutan-2-one

To a solution of dimethylsulfone (42 g, 0.45 mole) in dimethylsufoxide (225 ml), 60% sodium hydride (17.9 g, 0.45 mole) was added in a small portion at 18°–20° C., stirring was continued at 65°–70° C. for 30 minutes, and then diluted with tetrahydrofuran (225 ml). Then to this mixture, a solution of methyl 3-phenylpropionate (36.6 g, 0.22 mole) obtained in above (1) in tetrahydrofuran (110 ml) was added dropwise at 33°–41° C., and reacted for 1 hour with stirring. After cooling, the reaction mixture was poured into dilute hydrochloric acid, extracted with chloroform (100 ml×5), the organic layer was washed with H$_2$O (200 ml×3), saturated aqueous NaHCO$_3$ (200 ml×1), then H$_2$O (200 ml), dried over anhydrous MgSO$_4$ and evaporated. The crude solid (60.8 g) was recrystallized from ethyl acetate to give 24.7 g of 1-methylsulfonyl-4-phenylbutan-2-one as white needles.

m.p. 97.6°–98.4° C.

$^1$HNMR δppm (CDCl$_3$): 2.91–3.09(7H, m, CH$_2$ CH$_2$ and CH$_3$), 3.99(2H, s, CH$_2$), 7.16–7.33(5H, m, Aromatic).

IR (KBr-disk) νcm$^{-1}$: 1730(C=O), 1320, 1305.

(3) Synthesis of 1-diazo-1-methylsulfonyl-4-phenylbutan-2-one

To a solution of 1-methylsulfonyl-4-phenylbutan-2-one (12 g, 0.05 mole) obtained in above (2) in methylene chloride (135 ml), triethylamine (11.5 g) was added dropwise, and stirring was continued for 30 minutes. To this solution, p-toluenesulfonyl azide (11.5 g, 0.06 mole) obtained in Synthesis Example 10, (1), was added dropwise at 0°–5° C., followed by reaction at the same temperature for 5 hours and the solvent was removed. The residual solid (26.6 g) was recrystallized from carbon tetrachloride to afford 7.5 g of 1-diazo-1-methylsulfonyl-4-phenylbutan-2-one as pale yellow needles having a melting point of 52.5°–54° C.

$^1$HNMR νppm (CDCl$_3$): 2.88–3.07(4H, m, CH$_2$CH$_2$), 3.17(3H, s, CH$_3$), 7.16–7.35(5H, m, Aromatic).

IR(KBr-disk) νcm$^{-1}$: 2120(CN$_2$), 1655(C=O), 1335, 1315.

SYNTHESIS EXAMPLE 16

Synthesis of 1-diazo-1-(p-toluenesulfonyl)-3,3-dimethylbutan-2-one (1) Synthesis of 1-(p-toluenesulfonyl)-3,3-dimethylbutan-2-one To a solution of 1-bromo-3,3-dimethylbutan-2-one (33.3 g, 0.19 mole) in dimethylsulfoxide (330 ml), sodium p-toluenesulfinate (34.9 g, 0.20 mole) was added in a small portion at 30°–40° C., and stirring was continued at 60°–70° C. for 18 hours. The resultant mixture was poured into ice-cold $H_2O$ (2 l), the precipitate was filtered by suction, washed with $H_2O$ and dried to give 41.6 g of 1-(p-toluenesulfonyl)-3,3-dimethylbutan-2-one as white crystals.

m.p. 119°–122° C.

$^1$HNMR δppm (CDCl$_3$): 1.12(9H, s, C(CH$_3$)$_3$), 2.45(3H, s, CH$_3$): 4.31(2H, s, CH$_2$), 7.36(2H, d, J=8Hz, Ar 3-H, 5-H), 7.82(2H, d, J=8Hz, Ar 2-H, 6-H).

IR (KBr-disk) νcm$^{-1}$: 1715(C=O), 1320, 1290.

(2) Synthesis of 1-diazo-1-(p-toleuenesulfonyl)-3,3-dimethylbutan-2-one

Using 1-(p-toluenesulfonyl)-3,3-dimethylbutan-2-one (20 g, 0.08 mole) obtained in step (1), the reaction was carried out in the same manner as described in Synthesis Example 15, (3), and the crude solid (24 g) was recrystallized from ethanol to give 12.6 g of 1-diazo-1-(p-toleuensulfonyl)-3,3-dimethylbutan-2-one as pale yellow microneedles.

m.p. 120.5°–121.5° C.

$^1$HNMR δppm (CDCl$_3$): 1.17(9H, s, C(CH$_3$)$_3$), 2.44(3H, s, CH$_3$), 7.34(2H, d, J=8Hz, Ar 3-H, 5-H), 7.93(2H, d, J=8Hz, Ar 2-H, 6-H).

IR (KBr-disk) νcm$^{-1}$: 2140(CN$_2$), 1660(C=O), 1305.

SYNTHESIS EXAMPLE 17

Synthesis of cyclohexyl 2-diazo-2-phenylsulfonylacetate (1) Synthesis of cyclohexyl 2-phenylsulfonylacetate To a solution of cyclohexyl 2-bromoacetate (15.6 g, 0.07 mole) in dimethylsulfoxide (120 ml), sodium benzenesulfinate dihydrate (15 g, 0.075 mole) was added in a small portion at 30°–40° C., and stirring was continued at 60° C. for 6 hours. The resultant mixture was poured into ice-cold $H_2O$ (1.5 l). The precipitate was filtered, washed with $H_2O$ and dried to afford 15.3 g of cyclohexyl 2-phenylsulfonylacetate as white crystals.

m.p. 35°–38° C.

$^1$HNMR δppm (CDCl$_3$): 1.11–1.82(10H, m, cyclohexylic CH$_2$x5), 4.11(2H, s, CH$_2$), 4.64–4.82(1H, m, cyclohexylic CH), 7.50–7.98(5H, m, Aromatic).

IR(KBr-disk) νcm$^{-1}$: 1735(C=O), 1290.

(2) Synthesis of cyclohexyl 2-diazo-2-phenylsulfonylacetate

Using cyclohexyl 2-phenylsulfonylacetate (10 g, 0.035 mole) obtained in above (1), the reaction was carried out in the same manner as described in Synthesis Example 15, (3), and the residual solid (11 g) was chromatographed on silica gel (Wakogel C-200, a trade name, mfd. by Wako Pure Chemical Industries, Ltd.) with n-hexane/methylenechloride (6/1→4/1→1/1) as eluent to afford 5.8 g of 2-diazo-2-phenylsulfonylacetate as a pale yellow oil.

$^1$HNMR δppm (CDCl$_3$): 1.15–1.86(10H, m, cyclohexylic CH$_2$x5), 4.73–4.89(1H, m, cyclohexylic CH), 7.47–8.07(5H, m, Aromatic).

IR (Neat) νcm$^{-1}$: 2160(CN$_2$), 1730(C=O), 1310.

EXPERIMENT 1

Using poly(p-tert-butoxystyrene-p-hydroxystyrene) obtained in Synthesis Examples 1, 3 and 4, the following compositions were prepared;

| | |
|---|---|
| Poly(p-tert-butoxystyrene-p-hydroxystyrene) | 3.0 g |
| Diethylene glycol dimethyl ether | 7.0 g |

Each composition was spin coated on a substrate such as a semiconductor and soft baked at 90° C. for 90 seconds on a hot plate to give a polymer film of 1 μm thick. The resulting polymer film was subjected to UV measurement.

Figure 2:
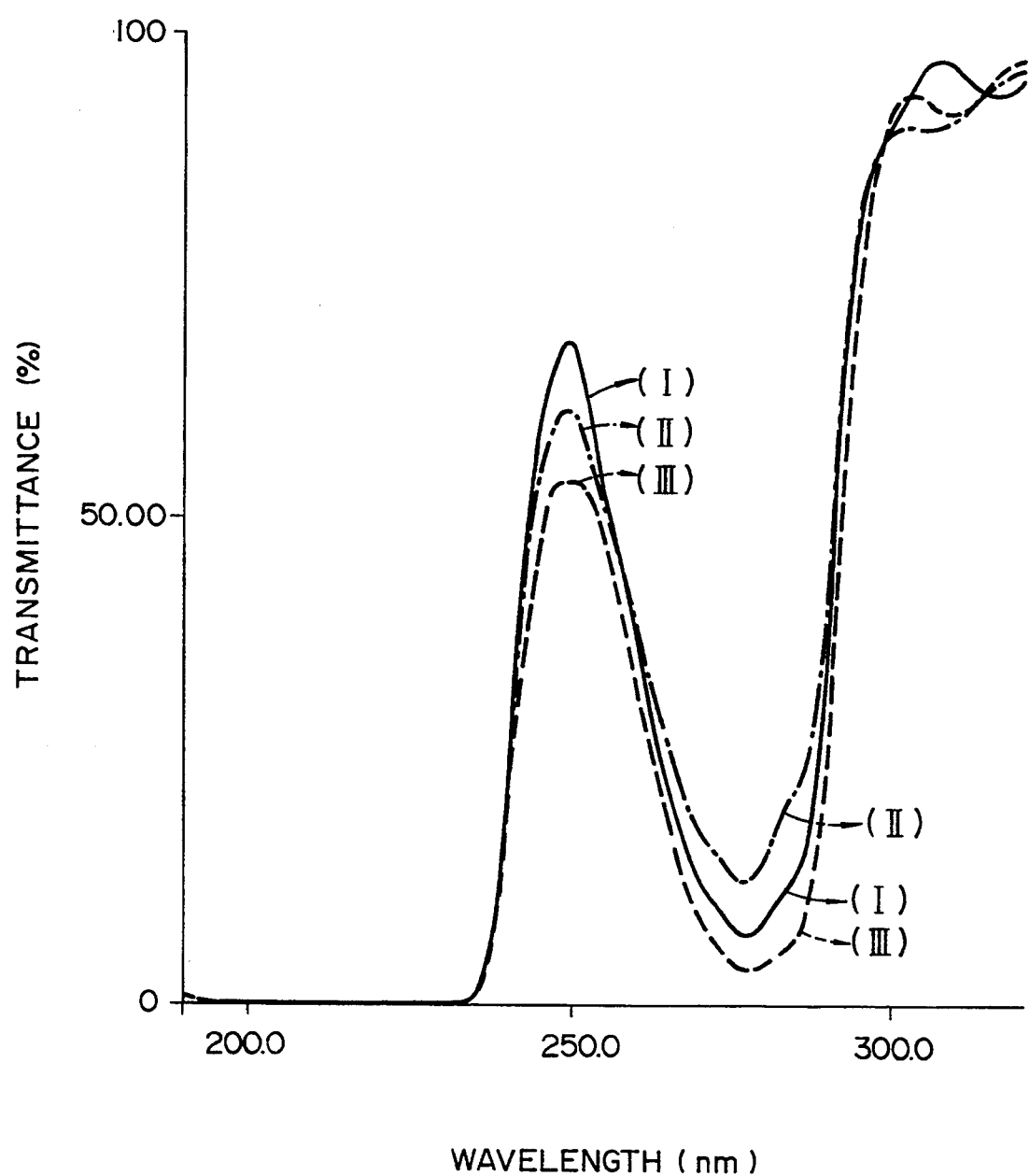
FIG. 2 is a graph showing UV spectral curves of resist material films obtained in Experiment 1.

FIG. 2 shows UV spectra, wherein the curve I is a UV spectral curve of the resist material film using the polymer obtained in Synthesis Example 1, the curve II is that of the resist material film using the polymer obtained in Synthesis Example 3, and the curve III is that of the resist material film using the polymer obtained in Synthesis Example 4. As is clear from FIG. 2, the resist material film using the polymer obtained in Synthesis Example 1 is by far excellent in the transmittance for light of near 240–250 nm compared with the resist materials using the polymers obtained in Synthesis Examples 3 and 4.

EXPERIMENT 2

Using polymers obtained in Synthesis Examples 1(1), 1(2), 6(1) and 6(2), comparison was made as to heat resistance and adhesiveness.

The heat resistance test was carried out by measuring the glass transition temperatures (Tg) of individual polymers using differential thermal analysis (DTA).

The test for adhesiveness to the substrate was carried out by preparing the following resist material, forming a pattern as mentioned below, and evaluating with the naked eye.

| | |
|---|---|
| Polymer | 6.0 g |
| 2,4-dimethyl-2-(p-toluenesulfonyl)-pentan-3-one(photoacid generator obtained in Synthesis Example 13) | 0.3 g |

Figure 1B:
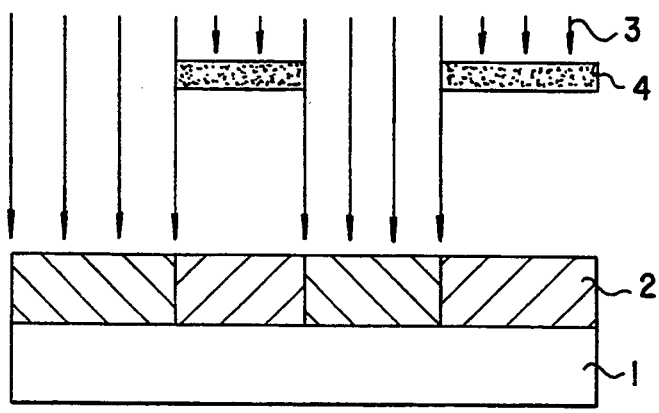
Figure 1C:
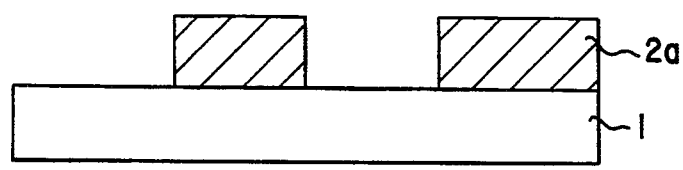

The pattern forming method is explained referring to FIG. 1. The resist material 2 as mentioned above is spin coated on a substrate 1 such as a semiconductor, and soft baked at 90° C. for 90 seconds on a hot plate to give a resist material film of 1.0 μm thick (FIG. 1(a)). Then, the resist material film is exposed to KrF excimer laser light 3 of 248.4 nm selectively via a mask 4 (FIG. 1(b)). After baking at 110° C. for 90 seconds on a hot plate, development is carried out using an alkali developing solution (a 2.38% aqueous solution of tetramethylammonium hydroxide) for 60 seconds to remove only the exposed portions of the resist material film 2 to give positive pattern 2a (FIG. 1(c)).

The results are shown in Table 1.

TABLE 1

| Polymer | Tg (°C.) | Adhesiveness to substrate |
| --- | --- | --- |
| Synthesis Example 1(1) | 95 | No good |
| Synthesis Example 1(2) | 150 | Good |
| Synthesis Example 6(1) | 110 | No good |
| Synthesis Example 6(2) | 160 | Good |

As is clear from Table 1, the resist materials containing the polymers with the monomer units having phenolic hydroxyl group (obtained in Synthesis Examples 1(2) and 6(2)) are better in the heat resistance and adhesiveness to substrate compared with the resist materials containing the polymers without the monomer units having phenolic hydroxyl group (obtained in Synthesis Examples 1(1) and 6(1)).

EXAMPLE 1

Using the following resist material, the pattern was formed in the same manner as described in Experiment 2.

| | |
| --- | --- |
| poly(p-tert-butoxystyrene-p-hydroxystyrene) (polymer obtained in Synthesis Example 1) | 6.0 g |
| 2-(cyclohexylcarbonyl)-2-(p-toluenesulfonyl)propane (photoacid generator obtained in synthesis Example 9) | 0.3 g |
| Diethylene glycol dimethyl ether | 13.7 g |

The resulting positive tone pattern had resolution of 0.3 μm lines and spaces. The exposure energy amount was about 18 mJ/cm$^2$.

EXAMPLES 2 to 20

Resist materials containing 0.6 g of a polymer, 0.3 g of a photoacid generator and 13.7 g of diethylene glycol dimethyl ether as listed in Table 2 were prepared. Using these resist materials, a pattern was formed in the same manner as described in Experiment 2. The results are shown in Table 2.

TABLE 2

| Example No. | Polymer | Photoacid generator | Exposure energy amount (mJ/cm$^2$) | Post baking conditions (°C., sec) | Adhesiveness to substrate | Resolution (μm L/S) |
| --- | --- | --- | --- | --- | --- | --- |
| 2 | Synthesis Example 1 | Synthesis Example 10 | 25 | 100, 90 | Good | 0.30 |
| 3 | Synthesis Example 3 | Synthesis Example 10 | 29 | 100, 90 | Good | 0.45 |
| 4 | Synthesis Example 4 | Synthesis Example 10 | 32 | 100, 90 | Good | 0.50 |
| 5 | Synthesis Example 5 | Synthesis Example 9 | 12 | 110, 90 | Good | 0.35 |
| 6 | Synthesis Example 5 | Synthesis Example 9 | 12 | 110, 90 | Good | 0.35 |
| 7 | Synthesis Example 5 | Synthesis Example 10 | 24 | 100, 90 | Good | 0.35 |
| 8 | Synthesis Example 1 | Synthesis Example 11 | 15 | 90, 90 | Good | 0.40 |
| 9 | Synthesis Example 1 | Synthesis Example 12 | 15 | 90, 90 | Good | 0.40 |
| 10 | Synthesis Example 2 | Synthesis Example 9 | 22 | 100, 90 | Good | 0.30 |
| 11 | Synthesis Example 7 | Synthesis Example 9 | 12 | 110, 90 | Good | 0.50 |
| 12 | Synthesis Example 1 | Synthesis Example 13 | 18 | 100, 90 | Good | 0.30 |
| 13 | Synthesis Example 1 | Synthesis Example 9 | 15 | 110, 90 | Good | 0.30 |
| 14 | Synthesis Example 8 | Synthesis Example 10 | 25 | 100, 90 | Good | 0.30 |
| 15 | Synthesis Example 8 | Synthesis Example 7 | 20 | 100, 90 | Good | 0.20 |
| 16 | Synthesis Example 6 | Synthesis Example 13 | 20 | 100, 90 | Good | 0.35 |
| 17 | Synthesis Example 1 | Synthesis Example 15 | 25 | 100, 90 | Good | 0.35 |
| 18 | Synthesis Example 1 | Synthesis Example 14 | 12 | 90, 90 | Good | 0.35 |
| 19 | Synthesis Example 1 | Synthesis Example 16 | 18 | 100, 90 | Good | 0.35 |
| 20 | Synthesis Example 1 | Synthesis Example 17 | 30 | 80, 90 | Good | 0.40 |

As is clear from Table 2, when the pattern is formed by using the resist materials of the present invention, there can be obtained fine patterns of submicron order with good shape.

Further, as shown in Examples 2 to 4, when the pattern is formed by using the resist material containing the polymer obtained in Synthesis Example 1, a fine pattern can easily be formed with less exposure energy than the case of using the resist materials containing the polymers obtained in Synthesis Examples 3 and 4 (produced by Processes 2 and 3).

As mentioned above, when the resist materials of the present invention are used, fine patterns of submicron order with good shape can easily be obtained by using a light source of 300 nm or less such as deep UV light, KrF excimer laser light (248.4 nm), etc. Therefore, the present invention is very useful in ultrafine pattern formation in semiconductor industry. Needless to say, the resist materials of the present invention can be used for pattern formation by using not only deep UV light and KrF excimer laser light, but also i-line light (365 nm), electron beams, X-rays, etc.

What is claimed is:

1. A resist material comprising:
(a) a polymer represented by the formula:

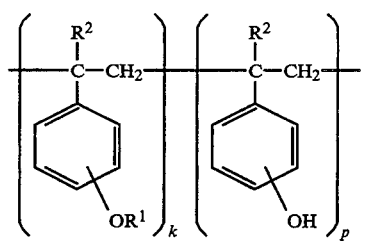

wherein $R^1$ is a methyl group, an isopropyl group, a tert-butyl group, a tetrahydropyranyl group, a trimethyl-silyl group or a tert-butoxycarbonyl group; $R^2$ is a hydrogen atom or a methyl group; and k and p are independently an integer of 1 or more provided that $k/(k+p)=0.1$ to 0.9, said repeating units (I) having a functional group which becomes alkali-soluble by chemical change during heating in the presence of an acid generated from a photosensitive compound when exposed to light;
(b) a photosensitive compound capable of generating an acid, when exposure to light, in an amount of 1 to 20 parts by weight per 100 parts by weight of said polymer; and
(c) a solvent for dissolving the components (a) and (b).

2. A resist material according to claim 1, wherein in the formula (I), $R^1$ is a tert-butyl group, a tetrahydropyranyl group or a trimethylsilyl group; and $R^2$ is a hydrogen atom.

3. A resist material according to claim 1, wherein in the formula (I), $R^1$ is a tert-butyl group; and $R^2$ is a hydrogen atom.

4. A resist material according to claim 1, wherein the polymer of the formula (I) is obtained by polymerizing a monomer of the formula:

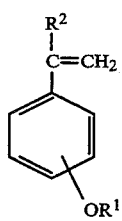 (IV)

wherein $R^1$ and $R^2$ are as defined in claim 1, and eliminating $R^1$ at predetermined proportion using a suitable acid.

5. A resist material according to claim 1, wherein the polymer of the formula (I) is obtained by polymerizing p-tert-butoxystyrene and eliminating $R^1$ at predetermined proportion using a suitable acid.

6. A resist material according to claim 1, wherein the photosensitive compound (b) is a compound of the formula:

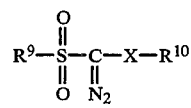 (VI)

wherein $R^9$ and $R^{10}$ are independently a straight-chain branched or cyclic alkyl group having 1 to 10 carbon atoms, a haloalkyl group having 1 to 10 carbon atoms or a group of the formula:

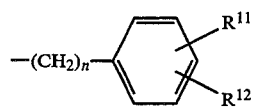

wherein $R^{11}$ and $R^{12}$ are independently a hydrogen atom, a lower alkyl group having 1 to 5 carbon atoms, or a haloalkyl group having 1 to 5 carbon atoms; n is zero or an integer of 1 or more; X is a carbonyl group, a carbonyloxy group or a sulfonyl group.

7. A resist material according to claim 1, wherein the photosensitive compound (b) is a compound of the formula:

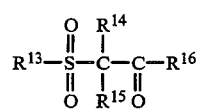 (XI)

wherein $R^{13}$ is a straight-chain, branched or cyclic alkyl group having 1 to 10 carbon atoms, a trifluoromethyl group, or a group of the formula:

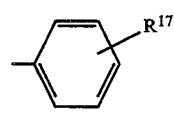

wherein $R^{17}$ is a hydrogen atom or a methyl group; $R^{14}$ and $R^{15}$ are independently a hydrogen atom, or a lower alkyl group having 1 to 5 carbon atoms; and $R^{16}$ is a straight-chain, branched or cyclic alkyl group having 1 to 10 carbon atoms, a phenyl group, a halogen-substituted phenyl group, an alkyl-substituted phenyl group, an alkoxy-substituted phenyl group, or an alkylthio-substituted phenyl group.

8. A resist material according to claim 1, wherein the photosensitive compound (b) is a compound of the formula:

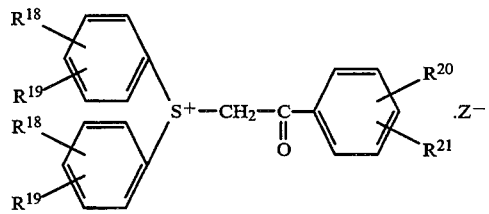

wherein $R^{18}$, $R^{19}$, $R^{20}$ and $R^{21}$ are independently a hydrogen atom, a halogen atom, a straight-chain, branched or cyclic alkyl group having 1 to 10 carbon atoms, or an alkoxy group having 1 to 10 carbon atoms; and $Z^-$ is a perchlorate ion, a p-toluenesulfonate ion or a trifluoromethanesulfonate ion.

9. A resist material according to claim 1, wherein the photosensitive compound (b) is a compound of the formula:

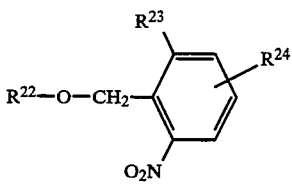

wherein $R^{22}$ is a trichloroacetyl group, a p-toluenesulfonyl group, a p-trifluoromethylbenzenesulfonyl group, a methanesulfonyl group or a trifluoromethanesulfonyl group; and $R^{23}$ and $R^{24}$ are independently a hydrogen atom, a halogen atom, or a nitro group.

10. A resist material comprising:
(a) a polymer represented by the formula:

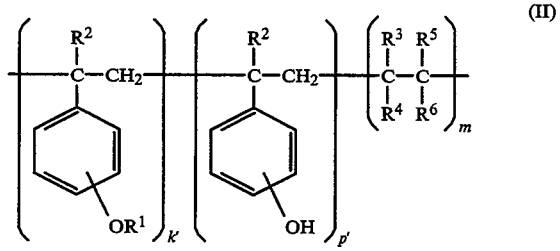

wherein $R^1$ is a methyl group, and isopropyl group, a tertbutyl group, a tetrahydropyranyl group, a trimethylsilyl group or a tert-butoxycarbonyl group; $R^2$ is a hydrogen atom or a methyl group; $R^3$ and $R^5$ are independently a hydrogen atom or a methyl group; $R^4$ is a hydrogen, carboxyl group, a cyano group, or a group of the formula:

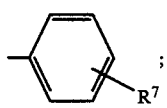

wherein $R^7$ is a hydrogen atom, a halogen atom or a lower alkyl group; $R^6$ is a hydrogen atom, a cyano group, or —$COOR^8$, $R^8$ is a straight-chain, branched or cyclic alkyl group having 1 to 10 carbon atoms; k', p' and m are independently an integer of 1 or more, provided that $0.1 \leq k'/(k'+p') \leq 0.9$ and $0.05 \leq m/(k'+p'+m) \leq 0.50$ said repeating units (II) having a functional group which becomes alkali-soluble by chemical change during heating in the presence of an acid generated from a photosensitive compound when exposed to light;
(b) a photosensitive compound capable of generating an acid, when exposed to light, in an amount of 1 to 20 parts by weight per 100 parts by weight of said polymer;
(c) a solvent for dissolving the components (a) and (b).

11. A resist material according to claim 10, wherein in the formula (II), $R^1$ is a tert-butyl group, a tetrahydropyranyl group, or a trimethylsilyl group; $R^4$ is a hydrogen atom or a cyano group; $R^6$ is a cyano group or a tert-butoxycarbonyl group; and $R^2$, $R^3$ and $R^5$ are independently a hydrogen atom.

12. A resist material according to claim 10, wherein in the formula (II), $R^1$ is a tert-butyl group; $R^4$ is a hydrogen atom or a cyano group; $R^6$ is a cyano group; and $R^2$, $R^3$ and $R^5$ are independently a hydrogen atom.

13. A resist material according to claim 10, wherein in the formula (II), $R^1$ is a tert-butyl group; $R^6$ is a tert-butoxycarbonyl group; and $R^2$, $R^3$, $R^4$ and $R^5$ are independently a hydrogen atom.

14. A resist material according to claim 10, wherein the polymer of the formula (II) is obtained by copolymerizing a monomer of the formula:

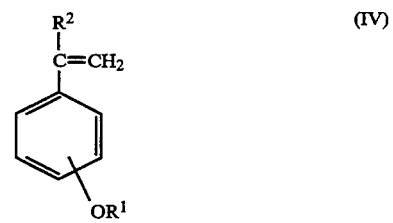

wherein $R^1$ and $R^2$ are as defined in claim 4, with a monomer of the formula:

wherein $R^3$ through $R^6$ are as defined in claim 4, and eliminating $R^1$ at predetermined proportion using a suitable acid.

15. A resist material according to claim 10, wherein the polymer of the formula (II) is obtained by copolymerizing p-tert-butoxystyrene and a monomer of the formula:

wherein $R^3$ through $R^6$ are as defined in claim 4, and eliminating $R^1$ at predetermined proportion using a suitable acid.

16. A resist material according to claim 10, wherein the photosensitive compound (b) is a compound of the formula:

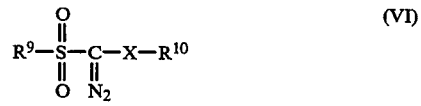

wherein $R^9$ and $R^{10}$ are independently a straight-chain, branched, or cyclic alkyl group having 1 to 10 carbon atoms, a haloalkyl group having 1 to 10 carbon atoms or a group of the formula:

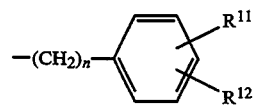

wherein R$^{11}$ and R$^{12}$ are independently a hydrogen atom, a lower alkyl group having 1 to 5 carbon atoms, or a haloalkyl group having 1 to 5 carbon atoms; n is zero or an integer of 1 or more; X is a carbonyl group, a carbonyloxy group or a sulfonyl group.

17. A resist material according to claim 10, wherein the photosensitive compound (b) is a compound of the formula:

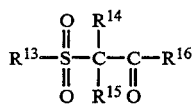

wherein R$^{13}$ is a straight-chain, branched or cyclic alkyl group having 1 to 10 carbon atoms, a trifluoromethyl group, or a group of the formula:

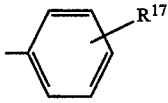

wherein R$^{17}$ is a hydrogen atom or a methyl group; R$^{14}$ and R$^{15}$ are independently a hydrogen atom, or a lower alkyl group having 1 to 5 carbon atoms; and R$^{16}$ is a straight-chain, branched or cyclic alkyl group having 1 to 10 carbon atoms, a phenyl group, a halogen-substituted phenyl group, an alkyl-substituted phenyl group, an alkoxy-substituted phenyl group, or an alkylthio-substituted phenyl group.

18. A resist material according to claim 10, wherein the photosensitive compound (b) is a compound of the formula:

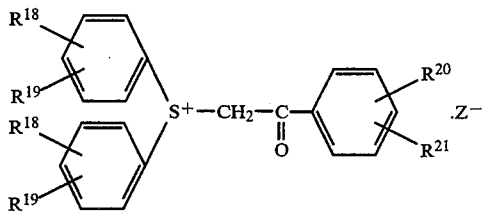

wherein R$^{18}$, R$^{19}$, R$^{20}$ and R$^{21}$ are independently a hydrogen atom, a halogen atom, a straight-chain, branched or cyclic alkyl group having 1 to 10 carbon atoms, or an alkoxy group having 1 to 10 carbon atoms; and Z$^{-}$ is a perchlorate ion, a p-toluenesulfonate ion or a trifluoromethanesulfonate ion.

19. A resist material according to claim 10, wherein the photosensitive compound (b) is a compound of the formula:

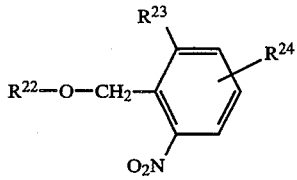

wherein R$^{22}$ is a trichloroacetyl group, a p-toluenesulfonyl group, a p-trifluoromethylbenzenesulfonyl group, a methanesulfonyl group or a trifluoromethanesulfonyl group; and R$^{23}$ and R$^{24}$ are independently a hydrogen atom, a halogen atom, or a nitro group.

* * * * *